(12) United States Patent
Woodward et al.

(10) Patent No.: US 8,466,819 B2
(45) Date of Patent: Jun. 18, 2013

(54) SYSTEM AND METHOD FOR SELECTIVE WAVELENGTH INTERLEAVED FILTERED TECHNIQUE (SWIFT) ADC

(75) Inventors: Ted K. Woodward, Holmdel, NJ (US); Tom Banwell, Howell, NJ (US); Anjali Agarwal, Matawan, NJ (US); Paul Toliver, Tinton Falls, NJ (US); Carol Martin, Fair Haven, NJ (US)

(73) Assignee: Telcordia Technologies, Inc., Piscataway, NJ (US)

( * ) Notice: Subject to any disclaimer, the term of this patent is extended or adjusted under 35 U.S.C. 154(b) by 0 days.

(21) Appl. No.: 12/889,788

(22) Filed: Sep. 24, 2010

(65) Prior Publication Data

US 2011/0234435 A1    Sep. 29, 2011

(51) Int. Cl.
*H03M 1/12* (2006.01)

(52) U.S. Cl.
USPC .......................................................... 341/137

(58) Field of Classification Search
USPC .......................................................... 341/137
See application file for complete search history.

(56) References Cited

U.S. PATENT DOCUMENTS

| | | | |
|---|---|---|---|
| 6,100,831 A * | 8/2000 | Frankel | 341/137 |
| 6,525,682 B2 * | 2/2003 | Yap et al. | 341/137 |
| 7,609,979 B2 * | 10/2009 | Taylor | 398/204 |
| 7,826,752 B1 * | 11/2010 | Zanoni et al. | 398/205 |
| 7,868,799 B1 * | 1/2011 | Price et al. | 341/137 |
| 2003/0091116 A1 | 5/2003 | Yap et al. | |
| 2004/0240775 A1 | 12/2004 | Jenkins | |
| 2005/0078317 A1 * | 4/2005 | Law et al. | 356/484 |
| 2005/0202793 A1 | 9/2005 | Baney et al. | |
| 2006/0245688 A1 | 11/2006 | Gall et al. | |
| 2009/0251345 A1 * | 10/2009 | Huang et al. | 341/137 |
| 2010/0046942 A1 * | 2/2010 | Taylor | 398/26 |

OTHER PUBLICATIONS

Paschotta, Optical Heterodyne Detection, RP Photonics, Encyclopedia of Laser Physics and Technology, internet URL http://www.rp-photonics.com/optical_heterodyne_detection.html; downloaded Feb. 21, 2012.*
Ip et al., Coherent detection in optical fiber systems, Optics Express, Jan. 21, 2008 / vol. 16, No. 2 p. 753-787.*
Cho. et al., Integrated Optical Coherent Balanced Receiver, © 2006 Optical Society of America, © 2006 OSA/COTA 2006.*
PCT International Search Report, Nov. 26, 2010.

\* cited by examiner

*Primary Examiner* — Howard Williams
(74) *Attorney, Agent, or Firm* — Philip J. Feig

(57) ABSTRACT

A system and method for selective wavelength interleaved filtering technique for analog to digital conversion (ADC) comprises a remote aperture for analog input, a modulator operable to transform the analog input into an initial optical signal, a photonic front end having high resolution optical filters operable to filter the optical signal into multiple subsequent optical signals and supply local oscillators for down-conversion into electrical signals, a segmented subsystem having a plurality of ADCs, each operable to receive and convert one subsequent optical signal of the optical signals, and a memory buffer and process subsystem operable to reconstruct the converted subsequent optical signals into a digital representation of the analog input by executing reconstruction algorithms. Provision is made for compensation of distortions arising in the electrical to optical to electrical conversion process. The optical filters can include a self-registered filter wherein individual passbands are intrinsically aligned to one another.

18 Claims, 10 Drawing Sheets

SYSTEM AND METHOD FOR SELECTIVE WAVELENGTH INTERLEAVED FILTERED TECHNIQUE (SWIFT) ADC

CROSS REFERENCE TO RELATED APPLICATIONS

This application claims the benefit of U.S. Provisional Application No. 61/245,851 filed on Sep. 25, 2009, the disclosure of which is incorporated herein by reference in its entirety.

FIELD OF THE INVENTION

The present invention relates generally to analog to digital converters (ADC) and photonics, and more specifically to high accuracy, high rate photonic ADCs.

BACKGROUND OF THE INVENTION

There are three primary challenges to be met with respect to photonically assisted ADC: quantizing, sampling, and reconstruction. There are fundamental challenges associated with sampling jitter and quantizing resolution. Commonly referred to as the 'Walden wall', these fundamental challenges have resulted in slow progress of ADC performance.

One challenge of high-resolution, high-speed photonic ADCs is the quantizer, or quantizing at high fidelity. There are very few physical systems that can provide sufficient (~1000 levels) resolving power for ten (10) effective number of bits (ENOB), which leads naturally to semiconductor ADCs as a nearly optimal candidate for this operation. Thus, a high-resolution photonic ADC can be viewed as a signal distribution system to permit multiple conventional ADCs to collectively deliver more performance than otherwise possible. These distribution networks can be based on time, space, or frequency, with the most favored approach being frequency-based distribution systems using wavelength division multiplexing (WDM) components, since they provide a relatively low-loss, passive, asynchronous signal routing mechanism. The near-universal adoption of frequency-based distribution naturally favors remaining in frequency space for sampling, too.

A second challenge for the high accuracy photonic ADCs is the performance of the electronic ADC sampler, that is, enhancing Sampler Performance. Aperture jitter can limit its performance, making it unsuitable for the high-speed operations desired. One approach to meet this challenge is to sample the signal before supplying it to the electronic ADC using a higher-performance method. This is often done by imposing the signal on an optical modulator that is sampled with a Mode Locked Laser (MLL) pulse. Such methods must address pulse jitter, amplitude variation, and various nonlinearity effects, and have received considerable study. Alternatively, an electronic sampler can be crafted using an optically-gated RF switch.

An alternative method for addressing sampler limitations is to execute an optical signal processing operation on the information that enhances sampler performance. One of the most popular approaches is the time-stretch ADC (TS-ADC), in which dispersive time spreading of a frequency chirped signal is coupled with a frequency-based signal distribution method to enhance the precision of conventional ADC samplers. A trade-off between spectral efficiency and dispersion bounds the range of this approach, with power spreading, optical loss and amplification providing another constraint. Recent TS-ADC work has focused on compensation of non-ideal dilation, dispersive nonlinearity, and modulation effects.

A third challenge is reconstruction of signals from separate electronic ADCs into a single output, that is, reconstruction of separate signals. This issue is not unique to photonic ADCs. Generally, this class of photonic ADC has exclusively used time-interleaved reconstruction. Selective Wavelength Interleaved Filtering Technique (SWIFT) reconstruction methods are based on hybrid filter channel bank (HFCB) methods operating in the frequency domain, capable of achieving near-perfect reconstruction of channelized input spectra. Applied to the ADC problem in the early 1990s, HFCB reconstruction is known to be less sensitive to interleaving errors than time domain approaches, particularly jitter related to high speed sampling. However, the gap between the performance of the electronic ADCs and the bandwidth of optical filters has hitherto been too great, making it untenable to apply frequency domain methods to the photonic ADC problem.

Some non-photonic attempts to solve the ADC problem have employed the HFCB technique in the electronic domain. However, they do not employ photonic filters or photonic local oscillator (LO) systems. Non-photonic solutions are subject to several limitations associated with the RF filtering and LO technology employed. For example, covering a very wide-band RF signal space is challenging because the filter technology changes as a function of frequency, and discrete LO signals are needed for each band.

Further, benefits of coherent optical frequency filtering for building channelizing RF filters have a long history. However, these efforts do not appear to have focused on the photonic ADC and by this omission exclude several key systems optimizations. Miniaturization was also not a focus. Finally, the combination of optical channel banks with HFCB reconstruction does not appear to have been addressed.

High resolution optical filters in the sub-GHz regime have been studied in Arrayed Waveguide Gratings (AWGs), silica-based ring resonators, and silicon micro-disk filters. Micro-structured resonators in general, while capable of sub-GHz response, are intrinsically infinite impulse response (IIR) elements, with strong phase distortion features. FIR response, being readily equalized, is therefore advantageous for HFCB applications. Echelle gratings, AWGs, and free space elements such as Virtually Imaged Phased Arrays (VIPA) have received study and reported GHz performance. All also beneficially provide a 'self-registered' characteristic in which filter passbands are registered to one another by virtue of the structure inherent to the filter and, beneficially, do not require individual alignment operations.

However, there is a need for technically superior ADC performance that overcomes the problems of existing systems. Further, there is a gap between ADCs and optical filter technology. Therefore, a need arises for technically superior ADC performance beyond the current state of the art, and an opportunity for photonically assisted ADC technology to meet this need, provided that several challenges can be overcome. Chief among these is a need for compatibility between optical filter technology and lower-rate ADCs.

SUMMARY OF THE INVENTION

An inventive solution to the need for high accuracy, high rate analog to digital converters (ADC) is presented. The Hybrid Filter Channel Bank (HFCB) is a proven method to attain multi-channel expansion of ADC performance that relies on frequency domain segmentation of signals. Recent advances in optical filter-bank technology and coherent optical signal processing enable a leap beyond traditional electronic HFCB approaches to achieve higher performance and lower DC power. A Selective Wavelength Interleaved Filtering Technique (SWIFT) analog to digital converter (ADC) can bridge the gap between ADCs and optical filter technology to introduce a frequency-based paradigm to photonic ADCs that can deliver technically superior ADC performance.

SWIFT implements a photonically-enabled ADC operating in the frequency domain, in contrast to prior approaches which operate in the time domain. Extensively applied in RF systems at lower rates, the novel HFCB approach utilizes photonics to scale HFCB to higher rates and uses innovative optical components for wide-band, space and power efficient distribution.

In one aspect, a system for selective wavelength interleaved filtering technique for analog to digital conversion comprises a remote aperture for analog input; a modulator operable to transform the analog input into an initial optical signal; a photonic front end having a plurality of optical filters operable to filter the optical signal into a plurality of subsequent optical signals and supply local oscillators for downconversion into electrical signals; a segmented subsystem having a plurality of analog-to-digital-converters (ADCs), each ADC operable to receive and convert one supplied electrical signal derived from the plurality of subsequent optical signals; and a process subsystem operable to reconstruct the plurality of converted subsequent optical signals into a digital representation of the analog input. In one aspect, IF conversion is used instead of baseband downconversion.

In one aspect, distortions that may arise in the electrical to optical to electrical conversion process are compensated. In one aspect, at least one of the plurality of optical filters includes a self-registered filter wherein individual passbands are intrinsically aligned to one another. In one aspect, the modulator is remote from the photonic front end. In one aspect, the process subsystem reconstructs the plurality of converted subsequent optical signals by executing hybrid filter channel bank reconstruction algorithms. In one aspect, the optical filters comprise analysis filters and optical local oscillator filters. In one aspect, the segmented subsystem further comprises memory operable to store the plurality of converted subsequent optical signals. In one aspect, the system further comprises stabilization of filters, and interferometric paths are tracked digitally. In one aspect, the filter bandwidth and the ADC bandwidth are related, and, in one embodiment of this aspect, the ADC bandwidth is equal to or greater than the filter bandwidth.

In one aspect, a method for selective wavelength interleaved filtering technique for analog to digital conversion comprises inputting analog input, transforming the analog input into an initial optical signal, filtering, using a photonic front end having a plurality of optical filters, the optical signal into a plurality of subsequent optical signals, receiving, using a plurality of ADCs, the plurality of subsequent optical signals and converting one supplied electrical signal derived from the plurality of subsequent optical signals using one ADC of the plurality of ADCs, and reconstructing the plurality of converted subsequent optical signals into a digital representation of the analog input.

In one aspect, the method further comprises a step of compensating for distortion. In one aspect, the analysis filters are a self-registered filter wherein individual passbands are intrinsically aligned to one another. In one aspect, the modulator is remote from the photonic front end. In one aspect, the step of reconstructing is performed by executing hybrid filter channel bank reconstruction algorithms.

In one aspect, a method for analog to digital conversion comprises segmenting, using a frequency segmentation, signals into frequency segmented signals in the optical domain using optical filters, digitizing said frequency segmented signals into multiple simultaneous digitizing elements, and reconstructing a digital representation of the analog signal from subsidiary segmented signals based on the multiple simultaneous digitizing elements, using digital filters whose characteristics are derived from those of said optical filters.

In one aspect, the optical signals are reconverted to electrical domain using a coherent optical local oscillator. In one aspect, the step of reconstructing employs hybrid filter channel bank methods. In one aspect, the optical filters are controlled and stabilized using heterodyne control systems.

A program storage device readable by a machine, tangibly embodying a program of instructions executable by the machine to perform methods described herein may be also provided.

Table 1 lists acronyms and abbreviations with their associated meanings as used herein.

TABLE 1

Table of Acronyms and Abbreviations

| Acronym or Abbreviation | Meaning |
|---|---|
| ADC | Analog to digital converter |
| AWG | Arrayed Waveguide Gratings |
| CF | Center Frequency |
| COTS | Commercial off-the Shelf |
| CW | Continuous Wave |
| DSO | Digital Sampling Oscilloscope |
| DSP | Digital Signal Processing |
| ECL | External Cavity Laser |
| EIB | Equivalent Input Bandwidth |
| ENOB | Effective Number of Bits |
| EOE | Electrical-Optical-Electrical |
| ER | Extinction ratio (Rejection Ratio) |
| FFT | Fast Fourier Transform |
| FIR | Finite Impulse Response |
| HFCB | Hybrid Filter Channel Bank |
| IF | Intermediate Frequency |
| IIR | Infinite Impulse Response |
| IMD | Intermodulation Distortion |
| $LiNbO_3$ | Lithium Niobate |
| LO | Local Oscillator |
| MASC | Modular Advanced Signal Channelizer |
| MLL | Mode Locked Laser |
| MZM | Mach-Zehnder Modulator |
| NF | Noise Figure |
| OCRP | Output Compensation and Reconstruction Processing |
| PDH | Pound-Drever-Hall |
| PFE | Photonic Front End |
| RF | Radio Frequency |
| RFLICs | RF Lightwave Integrated Circuits |
| RIN | Relative Intensity Noise |
| SAM | Segmented ADC and Memory subsystem |
| SDRAM | Synchronous dynamic random access memory |
| SFDR | Spurious Free Dynamic Range |
| SNR | Signal-to-Noise Ratio |
| SWIFT | Selective Wavelength Interleaved Filtering Technique |
| TIA | Trans-impedance Amplifier |
| TS-ADC | Time-Stretch ADC |
| VIPA | Virtually Imaged Phase Arrays |
| VPI ™ | Virtual Photonics, inc. (trade name) |
| WDM | Wavelength Division Multiplexing |

BRIEF DESCRIPTION OF THE DRAWINGS

The invention is further described in the detailed description that follows, by reference to the noted drawings by way of non-limiting illustrative embodiments of the invention, in which like reference numerals represent similar parts throughout the drawings. As should be understood, however, the invention is not limited to the precise arrangements and instrumentalities shown. In the drawings.

DETAILED DESCRIPTION

Figure 1:
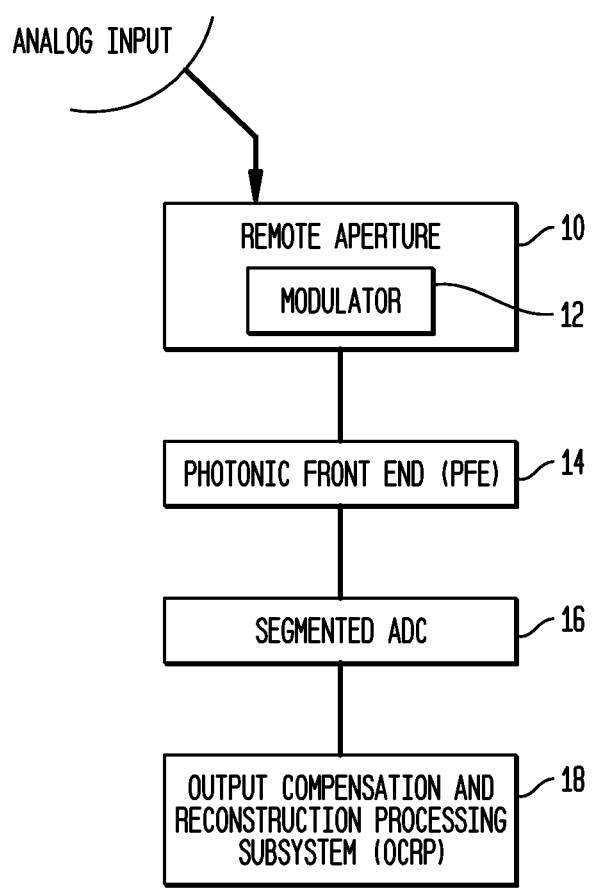
FIG. 1 is a schematic diagram of the SWIFT ADC.

FIG. 1 is a schematic diagram of the SWIFT ADC and its four building blocks, including remote aperture 10 with modulator 12, photonic front end (PFE) 14, segmented ADC comprised of a plurality of individual ADCs 16, and output compensation and reconstruction processing (OCRP) 18. As shown in FIG. 1, a simple modulator-based aperture element accepts input at a distance from the PFE element. The PFE derives high fidelity from an ultra-stable set of frequency references originating in an MLL optimized as a compact low-power source of low phase noise oscillators. At the heart of the PFE are a set of high resolution optical filters. Operating entirely in the frequency domain, the PFE executes critical signal processing and distribution functions to implement a coherent IF downconversion receiver array that segments and delivers IF data to a plurality of ADCs, each operable to receive and convert one supplied electrical signal derived from the plurality of subsequent optical signals. An OCRP element re-assembles the converted subsequent optical signals using HFCB reconstruction methods. During the process, analog link nonlinearities are digitally compensated, and PFE non-idealities are calibrated and compensated.

In one embodiment, the IF data is delivered to a third element, a SAM array using commercial ADCs. Each SAM element samples and digitizes a portion of the signal spectrum, and the OCRP element re-assembles the SAM outputs using HFCB reconstruction methods.

Figure 2:
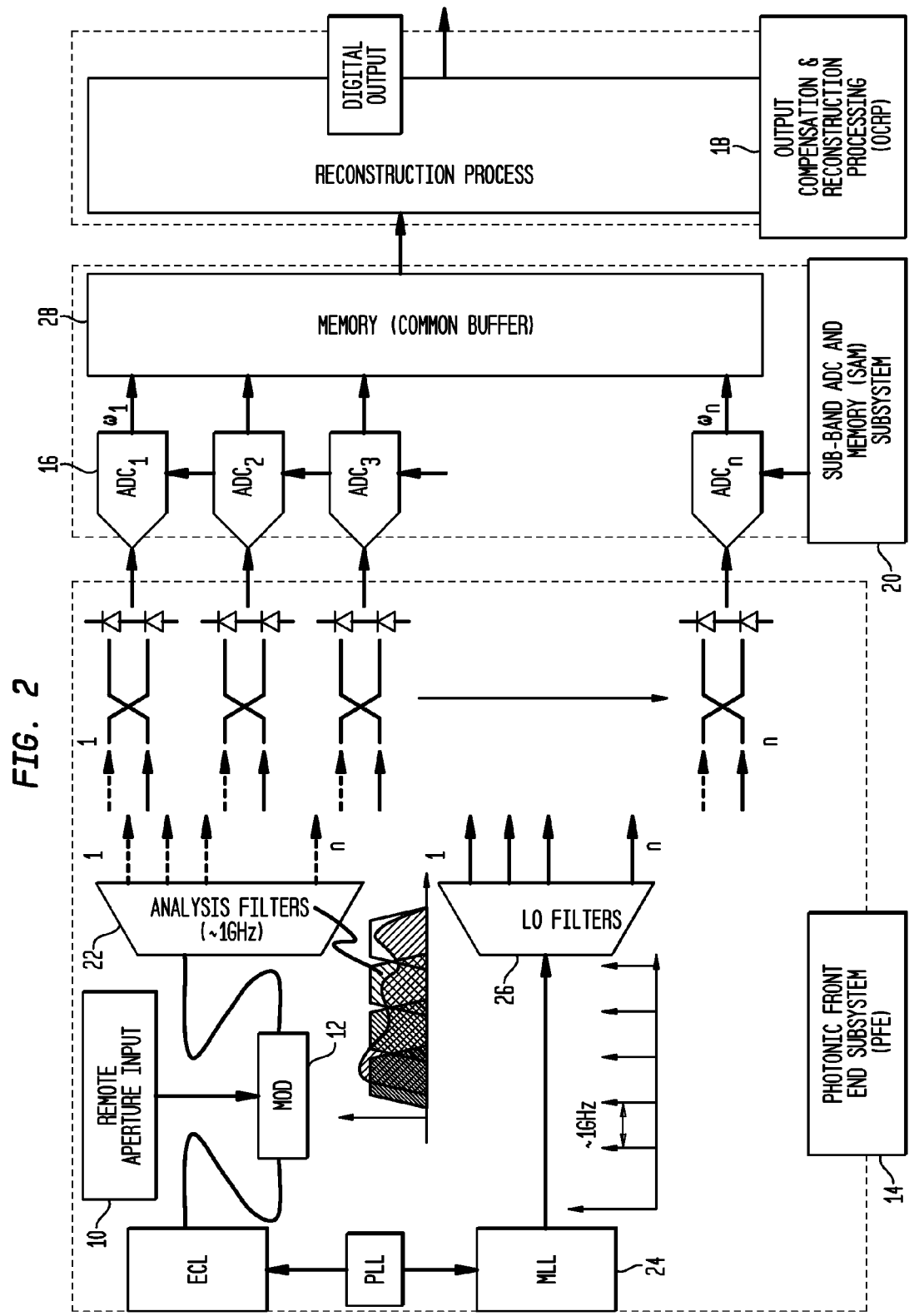
FIG. 2 shows an embodiment of the SWIFT system block diagram with emphasis on photonic element.

A system-level block diagram of one embodiment of the present invention is presented in FIG. 2, with an emphasis on photonic signal paths. This SWIFT system consists of a PFE 14 that distributes 1 GHz IF signals to a series of electronic ADCs 16 in a SAM subsystem 20, whose digital outputs are recombined in the OCRP 18. Segmentation, distribution, and digital conversion are primarily executed in the frequency domain. The PFE 14 is concerned with signal transfer and remoting, from signal source to the input of the SAM subsystem 20. As such, it must contend with remoting requirements, as well as delivering analog link performance sufficient to maintain analog signal fidelity and noise figure (NF) to support required system ENOB and NF. This performance is achieved with analysis filters 22, that is, a series of frequency domain optical filtering operations to channelize the input RF spectrum and extract optical local oscillators (LOs) from a common source, in this case proposed as a MLL comb. Approaches focused on time domain segmentation cannot attain such performance.

These analysis filters 22 can generally be a self-registered filter (in which individual passbands are intrinsically aligned to one another). These analysis filters 22 can achieve ~1 GHz resolution, compatible with emerging new generations of commercial ADC systems that comprise the SAM system. By using optical filters for this purpose, an entire bank of 10-12 RF filters can be realized in chip form with high extinction and Watt-level total power consumption. Similarly, banks of high performance optical LOs are realized in a single component, e.g., the MLL 24, with higher performance than RF synthesizers. LO signals are separated from one another with a single chip-scale filter element (the LO filter bank of FIG. 2). Still higher resolution can be achieved as optical filter technology improves.

Outputs of the analysis filters 22 are coupled with the outputs of the LO filters or the LO 26 signals in a coherent balanced photo-detection system. The resulting analog link will support the high dynamic range (69 dB) required for high resolution (~10 bit) ADCs. The ability to place and maintain the signal sensing element, in this case, the optical modulator 12, remotely from the processing elements can be useful. Using optical fiber technology, this can be achieved using the inventive SWIFT systems.

After detection, signals are supplied to the SAM subsystem 20, which performs analog to digital conversion on the individual frequency bands, and stores the results in a common buffer 28 for subsequent OCRP. For real time operation, the average read and write speeds of the buffer should match. The SAM hardware module must provide appropriate matching and alignment of signals and manage timing so that synchronized data streams are available to the OCRP and so that jitter performance of the constituent ADCs 16 is not compromised. ADCs 16 with greater than 2.5 GHz of equivalent input bandwidth (EIB) and greater than 1 GS/Sec sampling capacity at 12 bits resolution are forthcoming and will enable physical realization of a SWIFT system at this resolution level with overall bandwidth multiplied by parallel channelization, e.g. ten ADCs each covering 1 GHz of BW would yield a 10 GHz ADC.

Figure 3:
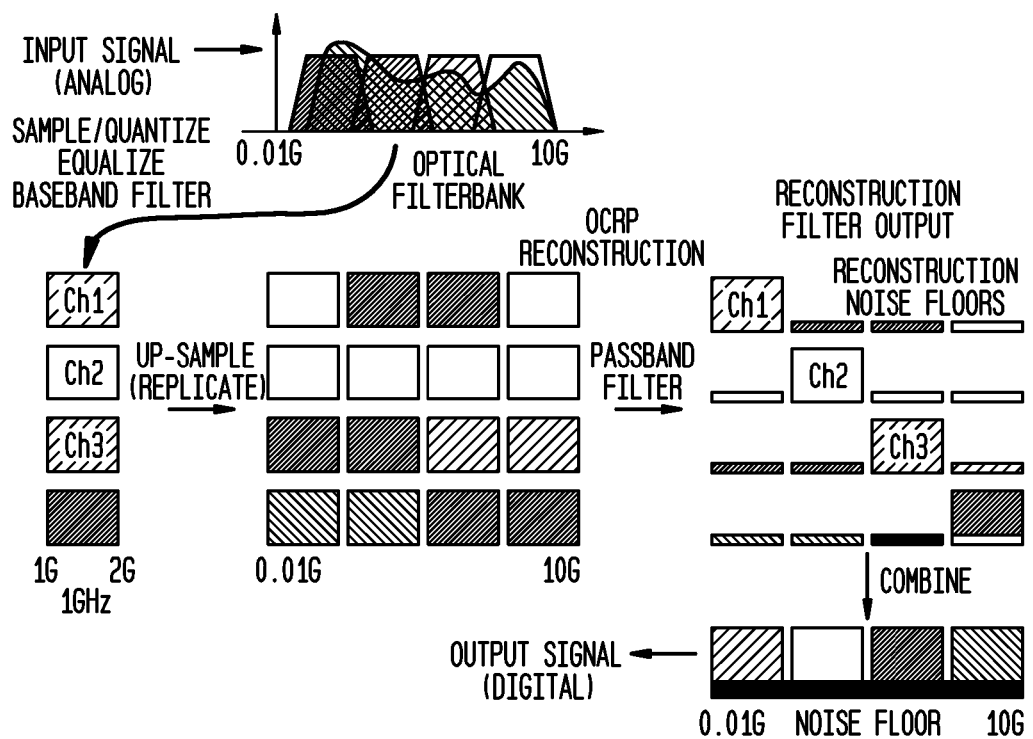
FIG. 3 shows signal flow through the HFCB-ADC with emphasis on DSP operations.

FIG. 3 illustrates the signal flow through the SWIFT ADC with emphasis on the DSP operations. The OCRP will execute HFCB near-perfect reconstruction algorithms capable of reconstructing a complete signal from channelized inputs with high accuracy. For the reconstruction algorithms to function with sufficient accuracy, extensive front-end equalization, compensation, and calibration processes will be implemented to address non-ideal behavior in the PFE, including differential channel skew and residual phase wander in the coherent downconversion process. It is possible for sampler aliasing to be compensated by the reconstruction algorithm in some cases. Equalization and further baseband filtering is performed on the digitized signals to create an ideal filter lineshape for HFCB reconstruction. The resulting set of baseband signals (at left in FIG. 3) are up-sampled by zero insertion, which creates replicas of the signal that span the entire frequency range (middle of FIG. 3).

The reconstruction filters select appropriate portions of each up-sampled signal. Undesired replicas are suppressed by the composite of digital analysis and reconstruction filters, whose design target is −70 dB stop band suppression, limited by gain matching and filter alignment errors. Cancellation provides excellent suppression but is sensitive to gain and phase mismatch between the channels. This stop band extinction is essential to suppress signal leakage from these aliased replica signals. The filtered replicas are combined to produce the reconstructed output signal. The DSP noise floor is dominated by residual signal leakage through the composite reconstruction and analysis filter set.

After reconstruction, post-distortion correction of analog link nonlinearities can be applied digitally to compensate for both photodiode saturation and filtered phase modulation nonlinearity. Demonstrated results of tests of this process are shown below. Real time and off line calibration procedures will be introduced to facilitate these operations.

Figure 4:
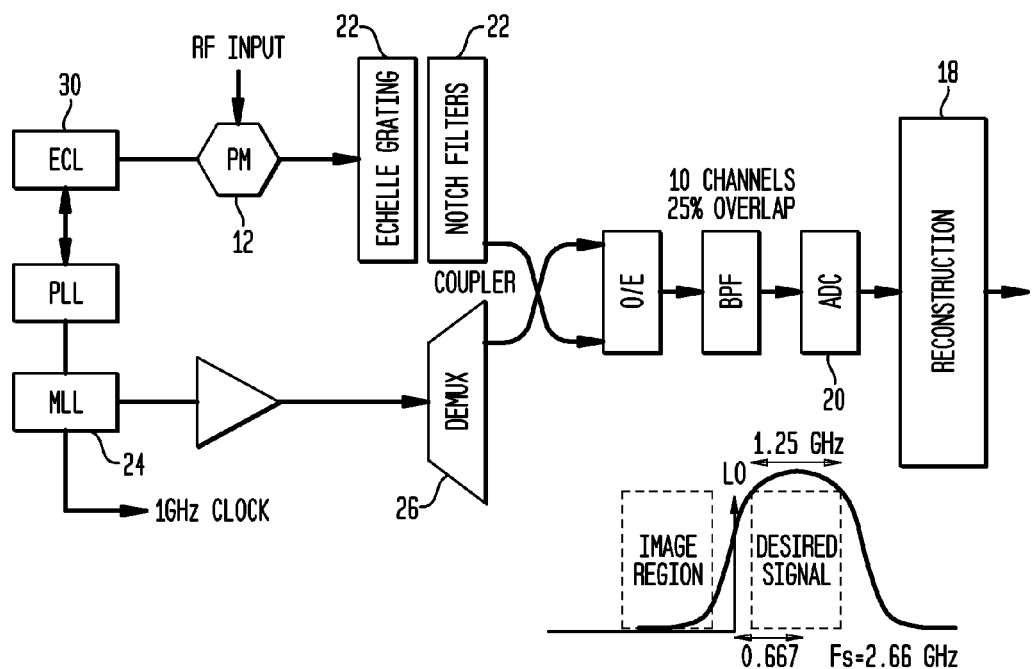
FIG. 4 is a single channel detail of a SWIFT system.

A block diagram of a single channel of a SWIFT system is shown in FIG. 4. Detailed analysis of each element of the system follows.

As discussed above, wideband ADC 16 can be constructed with lower speed ADC using time interleaving, time stretching, or HFCB. Time interleaving and HFCB share a common theoretical foundation. HFCB were introduced in the late 1980s and have found extensive use in wideband RF receivers; data transmission systems, and voice and image processing. Also, an 80 GS/s real-time digitizing oscilloscope that employs a two-channel RF filter bank has been introduced. Optical filter and ADC technology have attained a critical complementary status: the new optical filters can deliver the necessary gain and phase performance in a 1-2 GHz passband, while emerging ADC have a commensurate 4 GHz input bandwidth at 2-3 GS/sec sample rate. SWIFT can implement, for example, a 10 GHz 20 GS/s hybrid-filter channel bank ADC using innovations in the design and fabrication of narrowband optical filter banks that are suitable for RF signal channelization and subsequent digital signal reconstruction.

The HFCB approach requires multiple overlapping optical channels with identical passband shape and low insertion loss. Existing optical filter technology, discussed above, can achieve some but not all of the HFCB requirements. Single channel filters provide good filter shape and low insertion loss, but may incur a splitting loss when used in an array and must be individually tuned. This category includes Fabry-Perot filters, compound ring resonators and true-time-delay optical FIR/IIR filters. Filter bank arrays have been built with GHz passbands using wave-guide arrays, such as AWG, and free-space focal plane arrays, e.g. virtually imaged phased array or similar devices.

FIG. 4 illustrates one channel of the inventive implementation of the HFCB-ADC embedded in an analog coherent double conversion receiver. A wideband 0.01-10 GHz RF input signal is applied to a phase modulator whose optical source is a high power low phase external cavity laser (ECL) 30. E-O conversion gain is achieved using high optical carrier power ($P_C$=+25 dBm). The baseband RF signal is upconverted by phase modulation to sidebands of the optical carrier. The filter separates the first sideband into ten overlapping 1.25 GHz channels. Linearity is preserved by recovering an electrical IF signal using coherent optical detection with a set of phase-locked optical LO's.

The phase locked optical LO array is implemented using an MLL 24 and ring-resonator optical demultiplexer 26. The ECL 30 is phase locked to the MLL 24, which has lower intrinsic phase noise. Methods to preserve optical and electrical coherence through the entire system are described below. Additional O-E conversion gain is achieved using modest LO power ($P_{LO}$=+4 dBm). The system operates near the shot noise limit determined by the LO power incident on the photodetector with an EOE gain of 5.5 dB and 16.6 dB noise figure.

The recovered electrical IF signals are filtered and digitized by a bank of ten 12-bit 2.66 GS/s ADC. A passband IF was chosen instead of the baseband alternative, which requires two phase aligned receivers (I and Q) with tight control over photodetector common-mode-rejection. The optical LO is placed below the center of the optical channel passband as shown in FIG. 4 (inset), which centers the electrical IF on 667 MHz. DSP methods are used to extract baseband I and Q signals from the passband IF signal. The RF signal is reconstructed from the digitized IF signals using well-known HFCB principles. The filtered phase modulation link has a Bessel function non-linearity that is compensated using DSP methods described below.

The double conversion process generates numerous spurious signals. Three methods to suppress noise and intermodulation products in the recovered electrical IF signal can be employed. A dual arm phase modulator can suppress even order optical sidebands by 20-40 dB (including high power optical carrier). There are many second order intermodulation products created by optical square law detection; these are quite significant near DC. A balanced receiver suppresses optical LO RIN as well as even-order intermodulation terms by 20-30 dB. A passband IF centered on 667 MHz mitigates DC offset problems and also enhances IMD suppression near DC. An electrical IF filter limits aliasing from signals above the desired 1.25 GHz passband. The inset of FIG. 4 illustrates that there is an optical image region symmetric about the LO that is suppressed by the filter. DSP methods can also be employed to perform this image rejection.

Traditional photonically-assisted ADC methods predominantly apply time-domain reconstruction techniques. Such methods do not divide the signal into frequency bands, but rather divide them temporally. Thus the photonic front end, if it exists, is completely different from that illustrated in FIG. 2. For example, the signal may be sampled by the MLL, the LO bank may not exist, the analysis filter bank may not be present, and coherent photodetection using mixing with an LO laser may not be used.

Also, because of the losses associated with signal transmission at RF frequencies of interest for high rate, high accuracy ADC, it is very difficult to place filtering and LO processing electronics remote from the signal source. If the point of signal acquisition is in a physically challenging environment, it may not be convenient to locate all the necessary electronics and processing equipment nearby the signal source. On the other hand, using low-loss fiber optics and an optical modulator (as done in the inventive system), only the optical modulator need be located physically near the signal source. This ability to place the modulator 'remote' from the processing offers another distinction between the photonic implementation and the electronic implementation.

Additional attributes of the PFE and the downconversion of the signal that distinguish it from other optical attempts to address the ADC problem include the following.

One such attribute is the self-registered optical filter bank. Because the registration of the individual optical filters is important, it is highly desirable to employ a 'self-registered' optical filter bank, rather than a set of individual optical filters that must be individually registered to one another.

Another attribute is passband operation of optical filtering. Rather than downconvert to baseband (centered on DC), there are several advantages to operating in a passband configuration, facilitated by the availability of electronic ADCs having higher operating bandwidth than their Nyquist sampling rate.

Yet another attribute is coherent downconversion. Phase coherent optical process methods are distinctive from intensity-based systems in this fashion.

Other attributes include alignment and control methods. Because a coherent system is being operated, individual signals must be optically phase coherent with one another. A variety of alignment and control systems can maintain accurate performance of the photonic system. In particular, digitally assisted phase locking methods are a recent development in optical communication systems that can be applied to this problem, although it is not traditional or obvious to do so.

Moreover, there must be compatibility between the rate and resolution of the sub-rate ADCs and the resolution of the optical filter.

While the conventional approach to photonic ADCs uses an MLL to sample the data, the inventive system does not utilize an MLL as a sampler.

The use of two laser sources in the inventive system runs counter to conventional wisdom which dictates that single laser sources reduce challenges associated with phase referencing. In fact, the emergence of low noise, high power laser sources with integral phase locking capability makes the present solution superior to one in which the MLL is employed as the sampling source.

Passband operation of the photonic ADC system is unconventional since it requires higher bandwidth from the sub-rate electronic ADCs than otherwise. However, it is advantageous to reduce the number of samplers and ADCs employed in the subsequent SAM element.

HFCB reconstruction methods have been applied in electronic systems, but have not been used in photonically-assisted ADCs. The HFCB technique relies upon a high degree of reproducibility in the analog filters, therefore making its application to the inventive system non-obvious.

The inventive system advantageously achieves high rate, high accuracy ADC in accordance with the following. The system upconverts an electronic signal to the optical domain with high dynamic range and sensitivity, allows signal upconversion to take place remotely from digital conversion processing and optical sources, segments the optical signal into constituent spectral elements using an optical filter, derives multiple LO signals from a common MLL source, downconverts frequency segmented channels to a common intermediate frequency range through a coherent downconversion process, and through the use of balanced detection, suppresses common mode sources of noise, such as relative intensity noise of the laser. The novel system also phase locks MLL to ECL, registers and aligns the optical filter bank to the signal and LO sources, converts the subsidiary analog signals to digital form using subsidiary ADCs, provides calibration signals for alignment and compensation of variation between individual ADC elements, and reconstructs the complete signal from the subsidiary signals through the use of HFCB methods.

By reducing the rate requirements of individual ADCs and combining their signals, higher speed and resolution are possible than with a single ADC, thereby overcoming the 'Walden wall'. Further, the application of HFCB techniques to a composite ADC is known to provide reduced sensitivity to jitter and timing error compared to time interleaved methods, the dominant technique for photonically assisted ADC. By sampling the signal with multiple N-bit resolution ADCs, it is possible to obtain higher dynamic range than in systems that use only a single ADC at a time, thus obtaining better resolution. By employing lower-rate ADCs with lower power consumption, the composite ADC system can deliver reduced power dissipation compared to individual higher speed ADCs. Since sensitivity to mismatch error is confined to regions in which filters overlap one another, the approach has a reduced sensitivity to error compared to a time interleaved system.

Advantageously, many of the error compensation methods necessary to any composite ADC approach can be executed on a sub-band basis, and are confined to individual sub-bands, as opposed to being executed across the full bandwidth of the reconstructed signal. For continuous-time signals, frequency channels in which no signal is present can be disabled, providing a unique power saving opportunity compared to a time interleaved approach, for example, in which a continuous time signal would require all sub-rate ADCs to be active. High spectral efficiency is obtained compared to photonic systems employing time interleaving, since narrow frequency channels are employed. This provides the advantage of continued scaling of the solution to higher speed without the risk of running short of optical spectrum. For operation in the $2^{nd}$ Nyquist zone of available ADCs, performance demands on optical filters are significantly reduced compared to baseband or $1^{st}$ Nyquist zone. The opportunity to replace multiple discrete LO sources with a single component (the Mode Locked Laser) offers advantages in size, weight, and power relative to solutions that do not employ photonics. Optical domain filtering permits a self-registered and integrated solution compared to a set of discrete RF filters, providing an advantage relative to solutions that do not employ photonics.

A benefit of this system is the use of a single source for the array of local oscillators employed in the system, an unconventional and non obvious solution enabled by the mode locked laser.

The system SNR budget to produce different levels of ENOB conversion from the output of the OCRP subsystem is presented and followed by an accounting of the operating parameters and noise and error sources that must be considered to achieve this operating margin. These factors are the Analog Electrical-Optical-Electrical (EOE) link, laser phase noise, and factors contributing to reconstruction error floors.

System SNR and ENOB Budget: System performance at 8, 9, or 10 ENOB translates into performance requirements for the components and processes in the SWIFT digital backend. To evaluate these requirements, consider the elements that affect the dynamic range of the signal from the input to the SAM subsystem to the reconstructed output of the OCRP. Assuming perfect digital reconstruction, highly accurate channel matching, ideal sub-band ADC performance, and precise characterization of the optical channelizing filters, an output ENOB could be provided for an input signal with an SNR as determined from the standard relation of SNR=6.02× ENOB+1.76. Thus, in the ideal case, a system SNR of 61.96 dB would be required for 10 ENOB, and so forth. A −70 dB reconstruction error in the OCRP can be assumed; this error is well below the required output dynamic range, which provides some margin for non-ideality.

Aperture and EOE Link Analysis: The aperture has an electro-optic modulator which transforms the incoming RF signal into optical sidebands on a carrier from a high power external cavity CW laser. Commercial $LiNbO_3$ modulators can be employed due to their ability to handle high optical input powers. The gain and noise properties of the EOE path from the modulator input port (RF input) to an ADC input port can be examined.

Consider here a narrow band RF input signal represented by $Z(t)=\rho(t) \sin(\omega t+\theta(t))$. The wideband case is presented later. The optical signal created by a dual arm MZM phase modulator "tuned" for even-order suppression can be represented as $$E_C\left(\frac{1}{2}e^{j\beta Z} - \frac{1}{2}e^{-j\beta Z}\right) = jE_C\sin\beta Z \rightarrow E_C J_1(\beta\rho)e^{j\vartheta}$$

for the filtered sideband. The optical carrier power is $$P_C = \frac{1}{2}E_C^2 \text{ and } \beta = \pi/V_\pi$$

is the modulator gain. The signal generated by coherent detection with a square law receiver is $$\frac{1}{2}|E_{LO} - jE_C J_1(\beta\rho)e^{j\vartheta}|^2 \rightarrow E_{LO}E_C J_1(\beta\rho)\sin\vartheta \approx P_{LO}(E_C/E_{LO})\beta Z.$$

The resulting signal photocurrent is doubled with a balanced receiver. The IF voltage applied to the ADC input is $V_{IF}=2R_{TIA}I_{PD}(E_C/E_{LO})\beta Z$ where the nominal DC photocurrent $I_{PD}\approx P_{LO}$ is dominated by the LO signal. The narrow band voltage gain is 1.9 when $R_{TIA}=350$, $I_{PD}=1.1$ mA, $V_\pi=5$V, and $E_C/E_{LO}=3.8$ (including 6 dB channelizer insertion loss). A full scale ADC input voltage swing of 1000 mV pk-pk is obtained with a narrow band RF input of 532 mV pk-pk (−1.5 dBm). There are five components to the IF noise voltage: shot, LO RIN, LO phase noise, TIA noise current, and signal-ASE beating as shown in Table 2.

TABLE 2

System noise current densities

| Noise | Output Noise current density (s²) | Parameters |
|---|---|---|
| Shot<br>$\sigma_{SHOT}^2 = 4qI_{PD}B$ | 0.96 µA$_{rms}$ | $I_{PD} = 1.16$ mA<br>IF BW (B) = 1.25 GHz |
| LO RIN<br>$\sigma_{RIN}^2 = \epsilon \text{ RIN } I_{PD}^2 B$ | 0.052 µA$_{rms}$ | $I_{PD} = 1.16$ mA<br>Laser RIN =<br>−165 dB/Hz<br>Rx imbalance $\epsilon$ = 5% |
| LO Phase noise<br>$\sigma_{PN}^2 = f(v)I_{PD}$ | 0.58 µA$_{rms}$ | $I_{PD} = 1.16$ mA<br>Laser linewidth 1 KHz |
| EDFA ASE<br>$\sigma_{ase}^2 = 2h\nu I_{pd}n_{sp}\frac{G_l-1}{L_l}B$ | LO path:<br>0.49 µA$_{rms}$<br>Sig. path:<br>0.52 µA$_{rms}$ | $I_{PD} = 1.16$ mA<br>IF BW (B) = 1.25 GHz<br>$n_{sp} = 1.6$ |
| TIA noise<br>$\sigma_{TIA}^2 = (6\text{ pA})^2/\text{Hz}$ | 0.21 µA$_{rms}$ | EIN = 6 pA/Hz$^{1/2}$ |
| Output Thermal<br>$\sigma_{th}^2 = \frac{kTB}{R_{TIA}}g_c^2$ | 0.22 µA$_{rms}$ | $R_{TIA} = 350$ Ω<br>IF BW (B) = 1.25 GHz<br>Voltage gain ($g_c$) = 1.87 |
| Noise Figure<br>$NF = 1 + \frac{\sigma_{shot}^2 + \sigma_{rin}^2 + \sigma_{ase}^2 + \sigma_{PN}^2 + \sigma_{TIA}^2}{\sigma_{th}^2}$ | | NF = 16.1 dB<br>Noise at ADC input =<br>~0.5 mV$_{rms}$<br>With ADC 1 V$_{p-p}$ swing,<br>ENOB = ~11 bits |

Table 2 shows the noise voltage appearing at the ADC input is 0.50 m V$_{RMS}$, corresponding to an SNR of 66 dB. This is comparable to ADC input noise of 0.49 m V$_{RMS}$. The EOE link achieves a noise figure of 16.1 dB, even though an inexpensive commercial modulator with a $V_\pi$=5V is used. There is sufficient EOE gain to attain a system noise figure of 20.5 dB with an ADC noise figure of 24 dB. For 12-18 GHz operation, NF increases to 18 dB due to an anticipated increase in modulator $V_\pi$(~6V) with other factors remaining substantially unchanged. Overall system NF becomes 22.2 dB.

One might expect that optically filtered analog links are inferior to wideband optical analog links, traditional intensity modulation (IM), since they discard optical signal, e.g., bandwidth. The optical signal created by a dual arm MZM configured for IM with square law detection is $$\frac{1}{2}E_C^2\left|\frac{1}{2}e^{j\beta Z} + \frac{j}{2}e^{-j\beta Z}\right|^2 = \frac{1}{4}E_C^2(1+\sin 2\beta Z) \rightarrow P_C\beta Z.$$

This signal produces an IF voltage $V_{IF}=2R_{TIA}I_{PD}\beta Z$ where the DC photocurrent in this case is $$I_{PD} = \frac{1}{2}\eta P_C.$$

For a given photocurrent $I_{PD}$, the gain advantage shifts from intensity modulation to filtered phase modulation when $E_C \gtrsim E_{LO}$. For a small RF input voltage, most of the signal appears in the first sideband in either case. Optical filtering discards half of the optical signal power; however, this can be recovered using balanced detection.

While optical phase modulation is inherently linear, E-O-E conversion using phase modulation exhibits significant non-linearity. Whereas intensity modulation has a $$\sin(x) \approx x - \frac{1}{6}x^3$$

nonlinearity, filtered phase modulation exhibits a Bessel function nonlinearity. Consider a general input signal represented by $Z(t)=\Sigma_k\rho_k(t)\sin(\omega_k t+V_k(t))$ which has multiple component signals, each centered on a different frequency $\omega_k$. The first order upper optical sideband created by phase modulation with $Z(t)$ can be written $$E \propto \prod_p J_0(\beta\rho_p) \cdot \sum_k \frac{J_1(\beta\rho_k)}{J_0(\beta\rho_k)} e^{j(\omega_k t+\vartheta)}$$

The first product term represents power remaining in the optical carrier after modulation and can be approximated by $$\prod_p J_0(\beta\rho_p) \approx 1 - \frac{1}{4}\sum_p \beta^2\rho_p^2.$$

The effects of the product term can be compensated in the DSP following signal reconstruction since $\Sigma_p\rho_p^2$ is readily computed from the total power in each channel. The terms in the summation also impose a non-linearity which can be compensated on a channel-by-channel basis. The efficacy of post-distortion linearity compensation for the $J_1(\rho)$ distortion is demonstrated in FIG. 5 for a prototype 1-12 GHz optically filtered analog link. Two-tone measurements were performed at 8.05 GHz with 2 MHz tone spacing.

Figure 5:
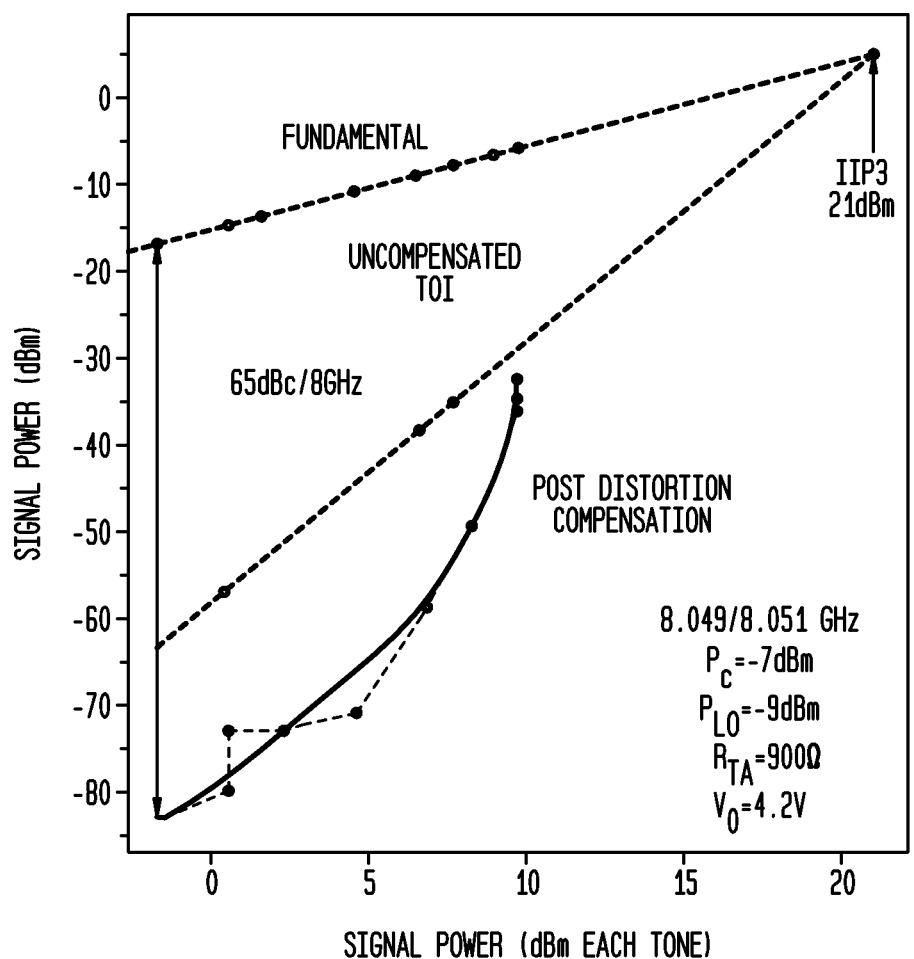
FIG. 5 shows measured response of optically filtered EOE link with and without post-detection compensation.

The link parameters are noted in FIG. 5. The 50 MHz IF waveform was recorded with an 8 bit real-time DSO and analyzed using an FFT. The measurements show an IIP3 of +21 dBm which is consistent with the $V_\pi$ of 4.2V where IIP3=$(4/\pi^2)V_\pi^2/R$. The uncompensated SFDR is 54 dBc at a single-tone power of −2 dBm (500 mV pk-pk), corresponding to βρ~0.2. The solid red line in FIG. 5 shows the IMD response obtained with compensation based on the known transfer function. The third order intermodulation is reduced by ~20 dB which increases the SFDR to 65 dBc. The improvement is limited by the digitizer (ADC) resolution (here 8 bits): the expectation is to achieve 70 dBc SFDR with 10 bit ADC resolution. The gain compression due to carrier depletion with all ten channels operating at βρ=0.2 is only ten percent; consequently, this can maintain channel SNR with all channels active and thereby achieve the $\sqrt{N}$ increase in dynamic range for wideband signals previously mentioned.

Figure 6:
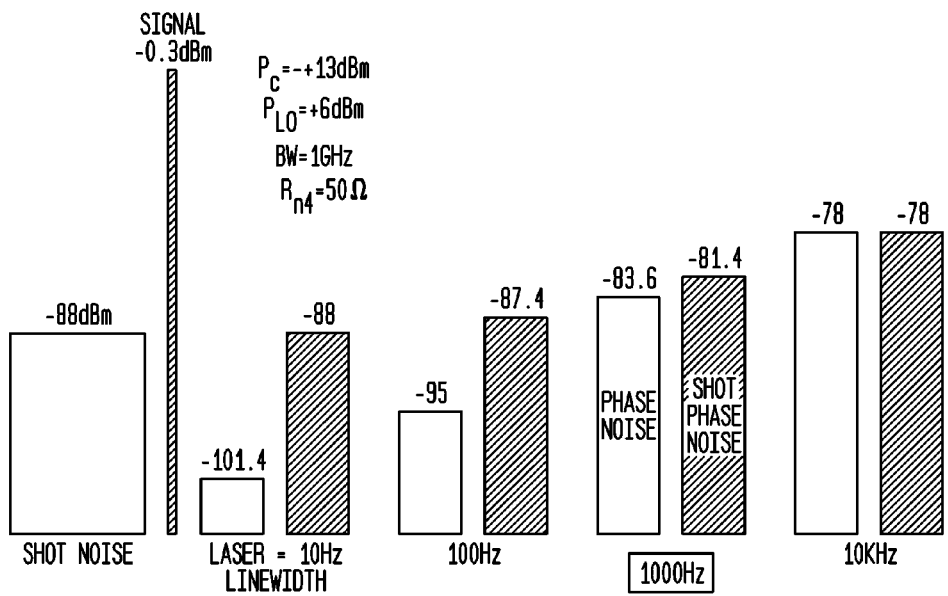
FIG. 6 shows optical phase noise contributions to noise floor.

Laser phase noise affects many aspects of optical ADC performance. The HFCB-ADC is more immune to laser phase noise effects than the time domain methods. Nevertheless, laser phase noise is de-correlated by narrow band optical filtering. As a result, there is an additional broadband component to the noise floor produced by square law detection that depends on the optical frequency offset and the ratio of laser linewidth to optical filter bandwidth. FIG. 6 illustrates the relative importance of laser linewidth on the receiver noise floor. The red bar illustrates shot noise floor with stopbands. The SFDR performance of the HFCB for filters stopband attenuation of −20 dB to −50 dB are shown. Unlike a TS-ADC, in the HFCB the aliasing error is attenuated by the filters and therefore the SFDR increases as the stopband attenuation increases. So although the worst case SFDR performance of HFCB and TS-ADC match, in the case of the inventive SWIFT system, performance for signals outside transition regions can be much higher.

To maximize the SFDR across as much of the band as possible, the transition region should be as narrow as possible and the stopband attenuation of the filters should be as high as possible. Recently published implementations of TS-ADC use a pilot tone (sine wave) to calibrate the channel gains in real time as part of the stitching process. The corresponding approach for HFCB is a calibration comb line in each channel (calibration impulse), which can be provided externally from a calibration impulse, or can make use of opportunistic signals that are present in overlapping regions of the filters and thereby appear in multiple channels and assumed equal.

Reconstruction Sensitivities also include Channel to Channel, that is, in addition to gain offset and filter center frequency control, a number of other control and compensation parameters can occur in SWIFT. These include laser frequency control, as well as coherent phase drift between LO and signal. A comprehensive review of SWIFT solutions is addressed below with respect to control systems.

Two types of filters can be employed: analysis filters and local oscillator (LO) filters. A variety of technical solutions are possible for these filter types, as described previously. Table 3 summarizes requirements and proposed technical solutions.

TABLE 3

Different types of filters required, their purpose, key required performance, and proposed solution

| Filter Type | Function | Key requirement | Technical Solutions |
|---|---|---|---|
| Analysis Filter | Separates the different frequency components of RF signal. | Self-registered (low relative peak frequency error), multi-channel (>10), low group delay, 1-2 GHz Channel separation, high ER (40 dB) | AWG, VIPA, Echelle Gratings, or other self-registered structures. |
| L.O. Filter | Spatially separates different frequencies of the MLL and ensures high spectral purity for the resulting LO spectrum. | Multi-channel, Tunable to enable registration, 1-2 GHz channel separation, Ultra high ER (>70 dB). No group delay spec. | Ring Resonator filters. Micro-disk resonators based in silicon or silicon oxide or nitride. |

$P_{LO}$=+6 dBm and 1 GHz optical bandwidth. The blue bars show noise contributed by laser phase noise for various laser linewidths. These results were computed using VPI™ simulation. The result for 10 kHz linewidth was confirmed by laboratory measurement. There is little benefit to reducing the laser linewidth to 100 Hz or below, and thus, in one embodiment, the target is <1 kHz for both ECL and MLL.

Figure 7:
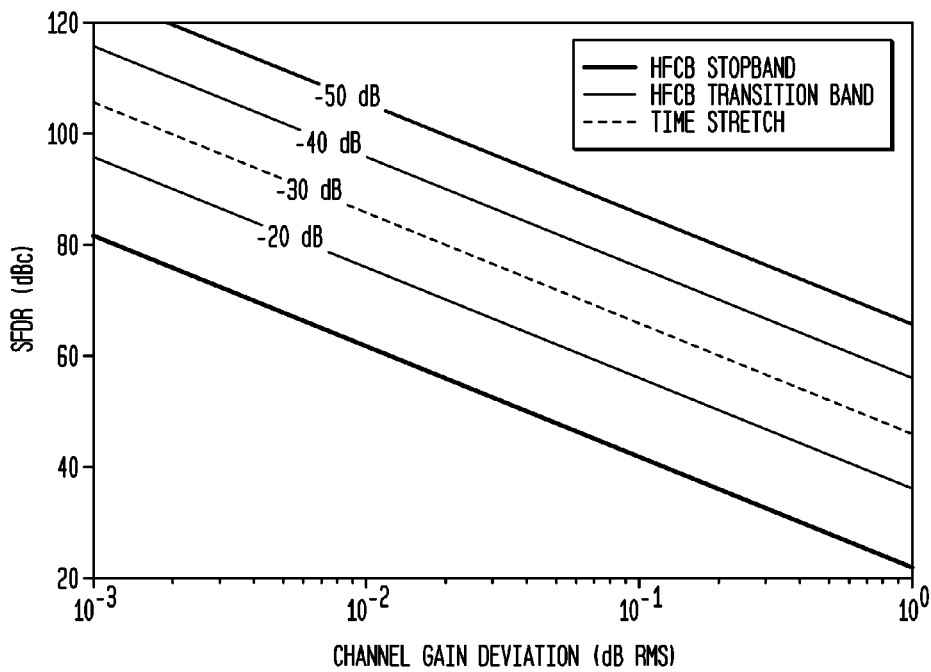
FIG. 7 shows a model of the relationship between spurious response and gain variation.

Reconstruction Sensitivities include Channel to Channel Gain Variation. FIG. 3 illustrates the signal flow through the HFCB-ADC with emphasis on the DSP operations. Sensitivities associated with reconstruction filtering cancellation can also be explored. All multi-channel ADC approaches are sensitive to channel gain errors that create spurious responses that degrade the noise floor. In the frequency domain, gain errors will be seen as undesired spurious signals, which degrade the SFDR of the system, with a sensitivity shown in FIG. 7. Even small gain mismatches degrade cancellation of aliasing, and hence the SFDR. For the HFCB, the maximum aliasing occurs at filter crossover frequencies where the stopband rejection is only 3 dB (shown as HFCB transition band). Outside transition regions aliasing is attenuated by filter bank The SAM subsystem is an influential component used in one embodiment of the SWIFT system. The major components of the SAM subsystem include COTS ADCs and their clock distribution. The variances of ADC gain, phase, and DC-offset are typically small relative to the non-idealities and variances of the optical filters, and thus the SAM should not limit SWIFT performance. Individual ADC elements must have ENOB compatible with performance requirements of the resulting composite ADC system. Further, the ADC must be compatible with the performance of the optical filter technology. Emerging commercial ADC systems have these characteristics.

Signal reconstruction is a related technical area. To reconstruct a digital version of the wideband analog input signal to meet fidelity requirements, the SWIFT reconstruction process must calibrate, compensate, and equalize the non-ideal behavior of the analog PFE system not tracked by analog control loops. These operations are collectively referred to as the OCRP subsystem, which will implement an HFCB reconstruction process. The HFCB process is well understood and has been proven by previous workers in electronic systems.

Figure 8:
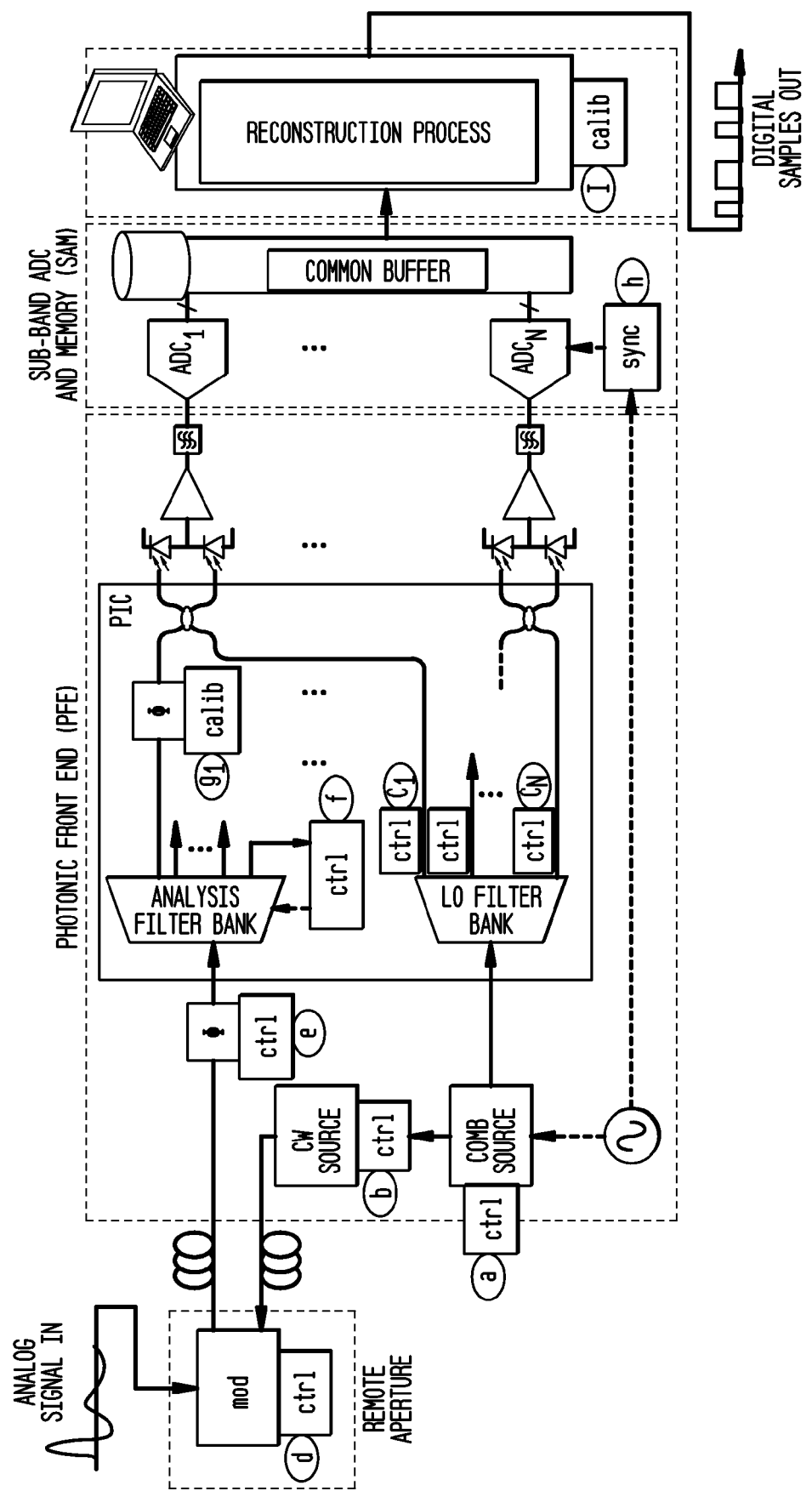
FIG. 8 is a block diagram of a SWIFT ADC system with critical calibration, control and synchronization elements highlighted.

To meet the ultra-high dynamic range requirements of an interleaved ADC, the photonic ADC can be under active control and stabilization. In addition, system calibration can be used to ensure accurate, repeatable sampling of analog signals. The SWIFT ADC system is shown in FIG. 8, with the control, synchronization, and calibration elements highlighted. As shown in FIG. 8, highlighted elements a-f are control (ctrl), elements g and i are calibration (calib), and element h is synchronization (sync). Both analog and digital control and calibration can be required. The highlighted elements in FIG. 8 include the following.

Comb source stabilization, element (a), stabilizes MLL to ensure minimal frequency drift. This can be done using an etalon in the MLL cavity.

XCL alignment, element (b), aligns, often precisely, CW laser source relative to the MLL. Since the MLL provides the master clock, phase-locking of the XCL to the MLL can be achieved using a piezo-based tuning in the XCL.

LO filter bank alignment, elements ($c_1 \ldots c_N$), align each individual LO filter to the appropriate frequency of an individual comb line. Alignment of the ring-resonator-based LO filter bank is achieved through dither lock control of these ring resonators, for example using a heterodyne control method.

Modulator bias control, element (d), sets the modulator bias for maximum carrier-suppression and prevents it from drifting. This can use the standard method of an integrated photodiode in the modulator to provide feedback to a control loop.

Signal/comb interferometric path stabilization, element (e), stabilizes the interferometric path between the optical sources and the balanced photodiodes. This stabilization and the calibration of Sub-band ADC synchronization can be closely coupled.

Figure 9:
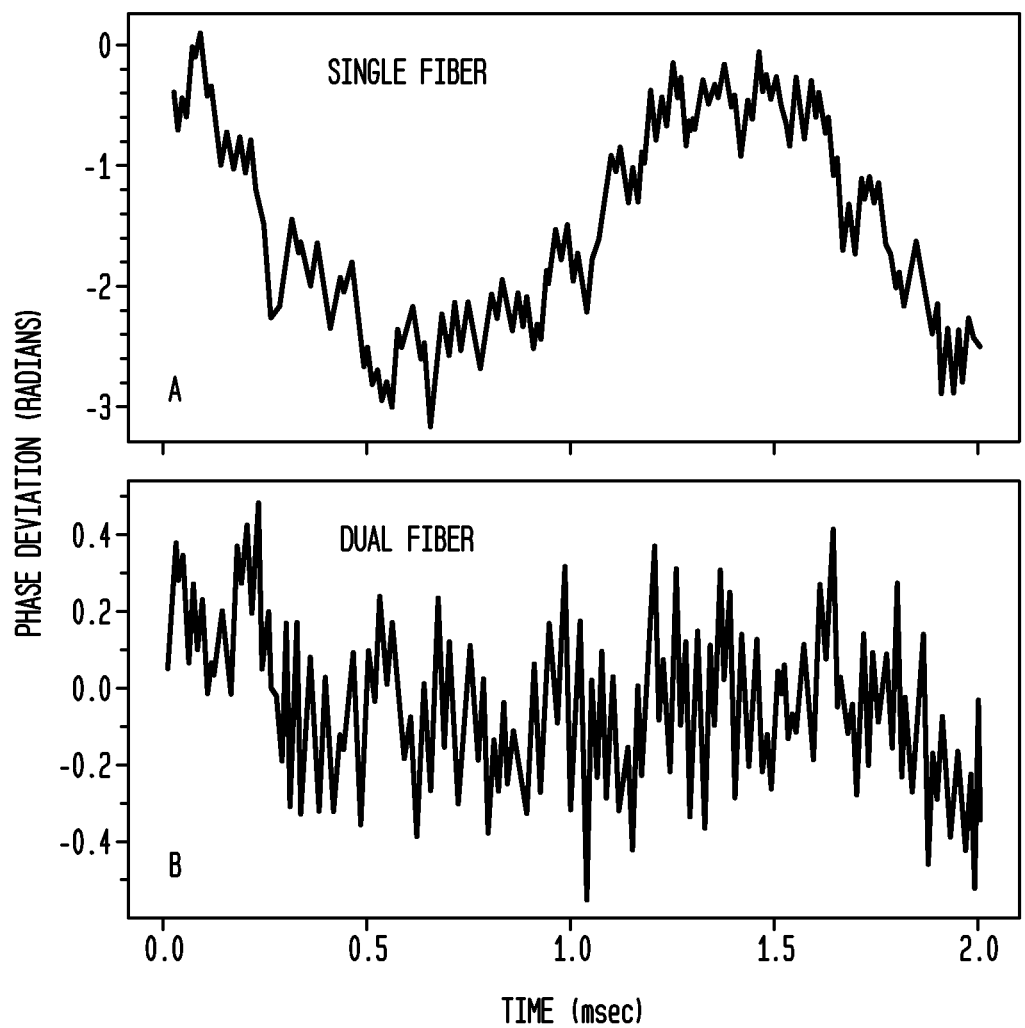
FIG. 9 shows interferometric phase variations for ~10 m fiber, (A) single fiber signal routing, (B) duplex fiber routing signal +LO.

The requirement to provide a remote aperture for the PFE can give rise to phase variation and drift between the LO path and the signal path in advance of coherent downconversion. This drift can be calibrated in real time to avoid excess gain mismatch. All multi-channel ADC designs assume that phase information is preserved by channelization process. In TS-ADC approaches, optical phase shift in the dispersive fiber produces signal fading which is denoted a "dispersion penalty". Dispersion is usually not an issue with the SWIFT system since the filters have nearly constant passband group delay. Reliance on coherent detection to preserve linearity in the detection process, however, does impact aperture remoting, since the LO and signal paths are physically separate. Fiber has a 10 ppm/° C. temperature coefficient that can result in appreciable phase variation. Fiber phase drift and vibration induced phase noise was experimentally measured in a test system using a 50 MHz pilot tone with coherent demodulation to baseband. FIG. 9(A) illustrates the phase variation measured with 10 m of fiber in signal path of the novel system. A slow thermal drift is evident, and hundreds of cycles of phase variation with 100° C. temperature change can be expected. Most of this variation can be removed by duplex fiber routing of signal and LO paths, shown in FIG. 9(B). Instantaneous frequency deviation for the single fiber experiment demonstrates that the phase noise spectrum extends to 18 kHz in both simplex and duplex routing.

Figure 10:
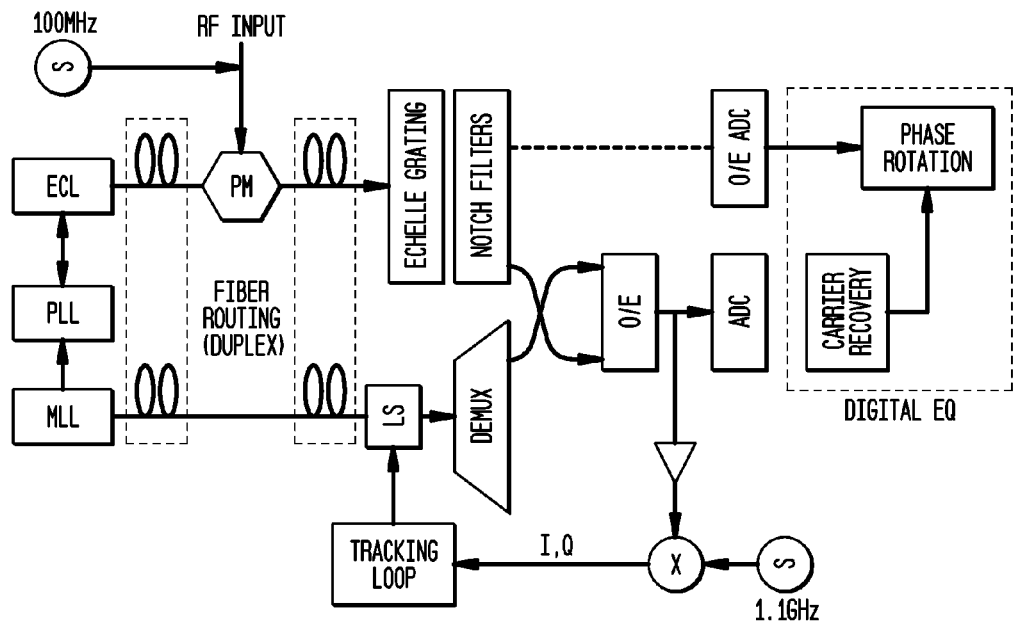
FIG. 10 shows a mechanism for tracking and compensating fiber phase variation using analog or digital carrier tracking.

Fiber induced phase variation typically affects all channels the same way. A 100 MHz pilot tone can be added at the RF input that is recovered in the low band channel. The effect of this signal on spectral coverage will be minimal, since the tone will be employed on only one channel and can be removed in the reconstruction process. However, detection of signals at this frequency will inevitably be impacted. Assuming a linewidth of 1 MHz, spectral coverage impact is at worst 1 MHz/10 GHz ~100 ppm. The recovered tone can be used to adjust a line stretcher or digitally correct phase rotations in the equalizers. A mechanism for use in one embodiment is shown in FIG. 10. This tone can also be used to assist blind equalization and calibration of individual channel gain matching.

Analysis filter bank alignment, element (f) in FIG. 8, aligns the entire analysis filter to the proper frequency relative to the LO filter bank. Since filters are self-registered, changes in filter response are characterized by pass-band center frequency (CF). Each filter channel may shift CF relative to ideal location by ±20-50 MHz. This static offset can be easily corrected by the equalizer. The CF spacing does not change significantly with time or temperature, and moves together with temperature variations.

Figure 11:
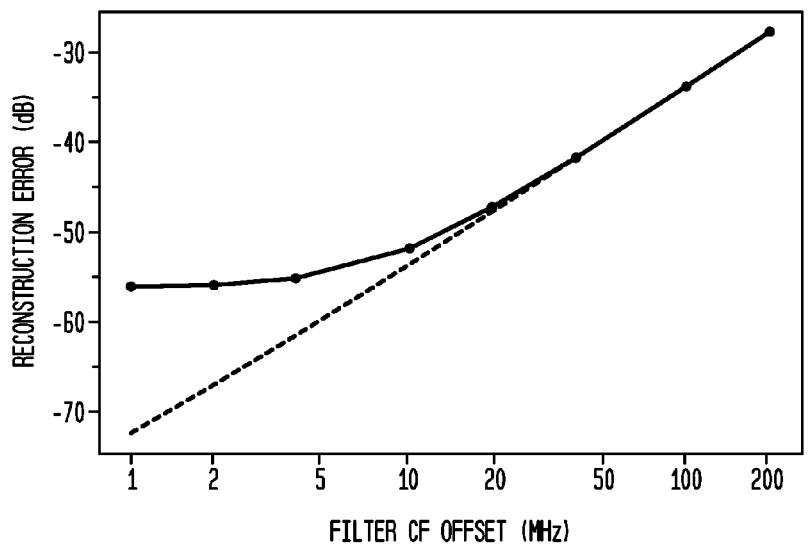
FIG. 11 show filter reconstruction error with filter center-frequency offset.
Figure 12:
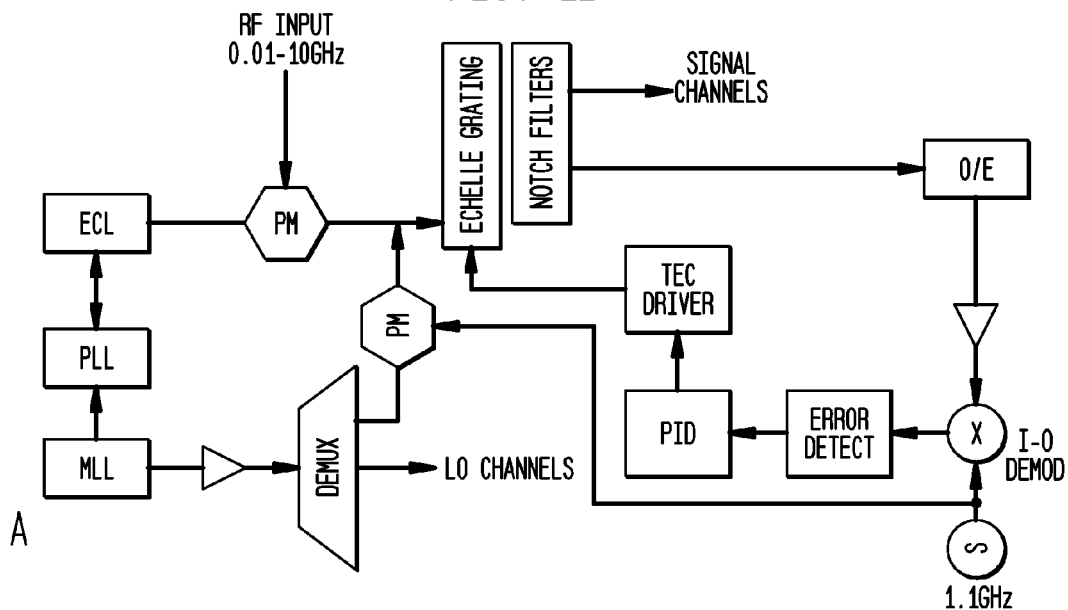
FIG. 12 shows (A) adaptation of PDH to lock analysis filter to MLL combs, (B) tuning of filter to maintain alignment of MLL combs, and (C) sideband frequency tuned for sharp error signal response.
Figure 12:
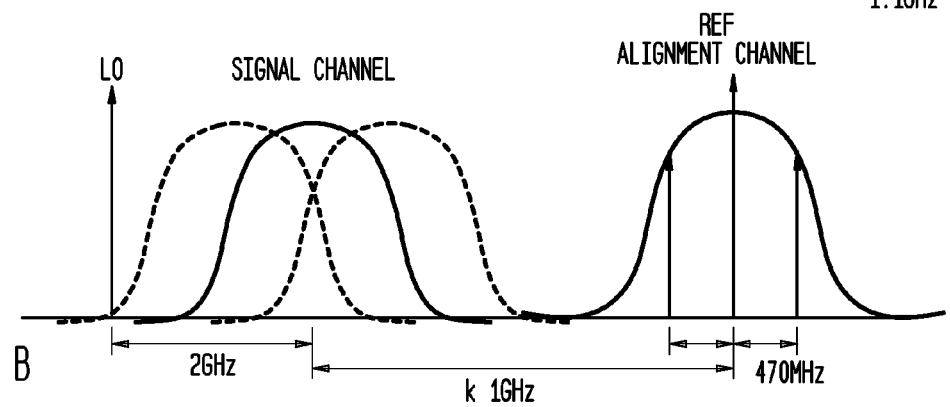
Figure 12:
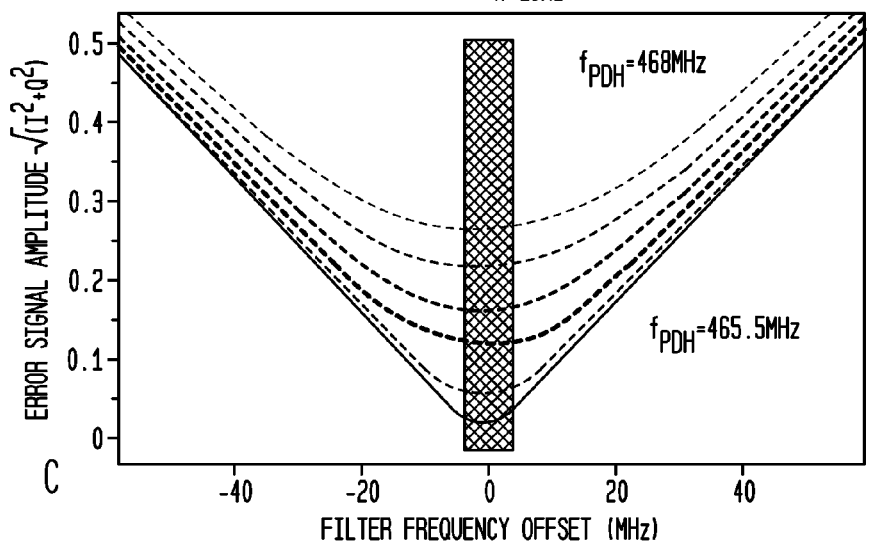

FIG. 11 illustrates the effect of filter center frequency offset on reconstruction error. The solid line is obtained from OCRP simulation. The dashed red line indicates the error attributed to CF offset alone. FIG. 11 illustrates that a CF variation of >5-10 MHz significantly degrades system performance. As shown in FIG. 12(A), the analysis filter can be aligned on a MLL comb line using a variant of the Pound-Drever-Hall method (PDH), originally developed to stabilize interferometers to extremely high precision. A MLL line is selected with the LO demultiplexer and phase modulated at about 465.5 MHz using a low $V_\pi$ modulator.

This creates two sidebands as illustrated in FIG. 12(B). The sidebands mix with the MLL carrier to produce a 465.5 MHz tone after square law detection that is demodulated to I and Q baseband signals with a low power quadrature converter. The I and Q signals contain information about the filter CF offset from the MLL line. This information can be processed in a number of ways. With an appropriate choice of sideband frequency, the tone amplitude $I^2+Q^2$ provides a good estimate of center frequency offset. The sideband frequency can be chosen so that the filtered sidebands are anti-phase at the filter output and cancel at zero offset. The phase between I and Q indicates the direction of the frequency offset. The predicted error response is shown in FIG. 12(C) for a range of sideband frequencies close to 465.5 MHz. It is possible to measure CF offset below 10 MHz reliably with this method. There are other tracking algorithms that do not require a "special" sideband frequency. The loop bandwidth of the PDH approach is sufficiently large that dominant pole compensation is achieved with the thermal time constant of the filter.

Signal band/LO comb line interferometric path calibration, elements ($g_1 \ldots g_N$), can include pre-calibration which makes the signal/LO optical path lengths between the filters and the couplers prior to coherent mixing at the balanced photodiodes equal for all ten channels. As mentioned above, a single pilot tone at 100 MHz for all ten channels can be used to calibrate the fiber induced phase variation.

Sub-band ADC synchronization, element (h), synchronizes the sample rate of the sub-band ADCs to the repetition rate of the LO comb source. This is made straightforward through access to a high precision output reference clock from the MLL that can be divided down from 1 GHz fundamental to an appropriate reference for the SAM system.

OCRP calibration, element (i), calibrates out imperfections in the photonic front end (PFE) and sub-band ADCs. This is based on digital equalization as discussed above.

Various aspects of the present disclosure may be embodied as a program, software, or computer instructions embodied in a computer or machine usable or readable medium, which causes the computer or machine to perform the steps of the method when executed on the computer, processor, and/or machine A program storage device readable by a machine, tangibly embodying a program of instructions executable by the machine to perform various functionalities and methods described in the present disclosure is also provided.

The system and method of the present disclosure may be implemented and run on a general-purpose computer or special-purpose computer system. The computer system may be any type of known or will be known systems and may typically include a processor, memory device, a storage device, input/output devices, internal buses, and/or a communications interface for communicating with other computer systems in conjunction with communication hardware and software, etc.

The terms "computer system" and "computer network" as may be used in the present application may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present application may include and may be included within fixed and portable devices such as desktop, laptop, and server. A module may be a component of a device, software, program, or system that implements some "functionality", which can be embodied as software, hardware, firmware, electronic circuitry, or etc.

The embodiments described above are illustrative examples and it should not be construed that the present invention is limited to these particular embodiments. Thus, various changes and modifications may be effected by one skilled in the art without departing from the spirit or scope of the invention as defined in the appended claims.

What is claimed is:

1. A system for selective wavelength interleaved filtering technique for analog to digital conversion, comprising:
   a remote aperture for analog input;
   a modulator operable to transform the analog input into an initial optical signal,
   a photonic front end having a plurality of optical filters operable to filter the optical signal into a plurality of subsequent optical signals and supply local oscillators for downconversion into electrical signals;
   a segmented subsystem having a plurality of analog-to-digital-converters (ADCs), each ADC operable to receive and convert one supplied electrical signal derived from the plurality of subsequent optical signals; and
   a process subsystem operable to reconstruct the plurality of converted subsequent optical signals into a digital representation of the analog input;
   wherein modulator distortion arising in the electrical to optical to electrical conversion process are compensated; and
   wherein at least one of the plurality of optical filters includes a self-registered filter wherein individual passbands are intrinsically aligned to one another.

2. The system according to claim 1, wherein the modulator is remote from the photonic front end.

3. The system according to claim 1, wherein the process subsystem reconstructs the plurality of converted subsequent optical signals by executing hybrid filter channel bank reconstruction algorithms.

4. The system of claim 1, wherein said optical filters comprise analysis filters and optical local oscillator filters.

5. The system of claim 1, wherein the segmented subsystem further comprises memory operable to store the plurality of converted subsequent optical signals.

6. The system of claim 1, further comprising stabilization of filters, wherein interferometric paths are tracked digitally.

7. The system of claim 1, wherein the filter bandwidth and the ADC bandwidth are related.

8. The system of claim 7, wherein the ADC bandwidth is equal to or greater than the filter bandwidth.

9. The system of claim 1, wherein said modulator has a bias control element.

10. A system for selective wavelength interleaved filtering technique for analog to digital conversion, comprising:
    a remote aperture for analog input;
    a modulator operable to transform the analog input into an initial optical signal, the modulator having a bias control element;
    a photonic front and having a plurality of optical filters operable to filter the optical signal into a plurality of subsequent optical signals and supply local oscillators for intermediate frequency (IF) conversion into electrical signals;
    a segmented subsystem having a plurality of analog-to-digital converters (ADCs), each ADC operable to receive and convert one supplied electrical signal derived from the plurality of subsequent optical signals; and
    a process subsystem operable to reconstruct the plurality of converted subsequent optical signals into a digital representation of the analog input;
    wherein at least one of the purality of optical filters includes a self-registered filter wherein individual passbands are intrinsically aligned to one another.

11. A method for selective wavelength interleaved filtering technique for analog to digital conversion comprising steps of:
    inputting analog input;
    transforming, the analog input into an initial optical signal;
    filtering, using a photonic front end having a plurality of optical filters, the optical signal into a plurality of subsequent optical signals;
    receiving, using a plurality of ADCs, the plurality of subsequent optical signals and converting_one supplied electrical signal derived from the plurality of subsequent optical signals using one ADC of the plurality of ADCs;
    reconstructing the plurality of converted subsequent optical signals into a digital representation of the analog input; and
    compensating for modulator distortion arising in the electrical to optical to electrical conversion process;
    wherein the optical filters are a self-registered filter wherein individual passbands are intrinsically aligned to one another.

12. The method according to claim 11, wherein the modulator is remote from the photonic front end.

13. The method according to claim 11, wherein the step of reconstructing is performed by executing hybrid filter channel bank reconstruction algorithms.

14. The method of claim 11, wherein said transforming is in accordance with a bias control element.

15. A method for analog to digital conversion, comprising steps of:
    segmenting, using a frequency segmentation, signals into frequency segmented signals in the optical domain using optical filters;
    digitizing said frequency segmented signals into multiple simultaneous digitizing elements; and
    reconstructing a digital representation of said analog signal from subsidiary segmented signals based on the multiple simultaneous digitizing elements, using digital filters whose characteristics are derived from those of said optical filters, wherein at least one of the purality of optical filters includes a self-registered filter wherein individual passbands are intrinsically aligned to one another.

16. The method of claim 15, wherein said optical signals are reconverted to electrical domain using a coherent optical local oscillator.

17. The method of claim 15, wherein said step of reconstructing employs hybrid filter channel bank methods.

18. The method of claim 15, wherein said optical filters are controlled and stabilized using heterodyne control systems.

\* \* \* \* \*

UNITED STATES PATENT AND TRADEMARK OFFICE
CERTIFICATE OF CORRECTION

PATENT NO.        : 8,466,819 B2
APPLICATION NO.   : 12/889788
DATED             : June 18, 2013
INVENTOR(S)       : Woodward et al.

It is certified that error appears in the above-identified patent and that said Letters Patent is hereby corrected as shown below:

On the Title Page, below "(65) Prior Publication Data", in Column 1, insert
-- Related U.S. Application Data --.

In the Drawings

In Fig. 5, Sheet 5 of 10, delete "-B0" and insert -- -80 --, therefor.

In the Specification

In Column 7, Lines 26-27, delete "receiver; data" and insert -- receivers, data --, therefor.

In Column 10, Line 67, delete "sin(ωt+θ(t))." and insert -- $\sin(\omega t + \vartheta(t))$. --, therefor.

In Column 16, Line 67, delete "machine A" and insert -- machine. A --, therefor.

In the Claims

In Column 17, Line 38, in Claim 1, delete "signal," and insert -- signal; --, therefor.

In Column 18, Line 16, in Claim 10, delete "and" and insert -- end --, therefor.

In Column 18, Line 29, in Claim 10, delete "purality" and insert -- plurality --, therefor.

In Column 18, Line 41, in Claim 11, delete "converting_one" and insert -- converting one --, therefor.

In Column 19, Line 4, in Claim 15, delete "purality" and insert -- plurality --, therefor.

Signed and Sealed this
Seventh Day of April, 2015

Michelle K. Lee
*Director of the United States Patent and Trademark Office*